US007412670B2

(12) United States Patent
Meyer et al.

(10) Patent No.: US 7,412,670 B2
(45) Date of Patent: Aug. 12, 2008

(54) METHOD AND APPARATUS FOR OPTIMIZING DISTRIBUTED MULTIPLEXED BUS INTERCONNECTS

(75) Inventors: Michael Jude Meyer, Palo Alto, CA (US); Scott C. Evans, Santa Clara, CA (US); Kamil Synek, Sunnyvale, CA (US)

(73) Assignee: Sonics, Inc., Milpitas, CA (US)

( * ) Notice: Subject to any disclaimer, the term of this patent is extended or adjusted under 35 U.S.C. 154(b) by 243 days.

(21) Appl. No.: 11/096,549

(22) Filed: Apr. 1, 2005

(65) Prior Publication Data

US 2005/0172244 A1 Aug. 4, 2005

Related U.S. Application Data

(62) Division of application No. 10/146,989, filed on May 15, 2002, now Pat. No. 6,880,133.

(51) Int. Cl.
*G06F 17/50* (2006.01)
(52) U.S. Cl. .............................. 716/2; 716/6
(58) Field of Classification Search ............... 716/1, 716/6, 9, 10, 2
See application file for complete search history.

(56) References Cited

U.S. PATENT DOCUMENTS

| 4,641,247 | A |   | 2/1987  | Laygesen et al. |        |
|-----------|---|---|---------|-----------------|--------|
| 4,685,104 | A |   | 8/1987  | Johnson et al.  |        |
| 4,799,216 | A |   | 1/1989  | Johnson et al.  |        |
| 4,827,428 | A | * | 5/1989  | Dunlop et al.   | 716/6  |
| 5,577,023 | A |   | 11/1996 | Marum et al.    |        |
| 5,615,126 | A |   | 3/1997  | Deeley et al.   |        |
| 5,625,563 | A |   | 4/1997  | Rostoker et al. |        |
| 5,627,480 | A |   | 5/1997  | Young et al.    |        |
| 5,724,250 | A | * | 3/1998  | Kerzman et al.  | 716/3  |
| 5,726,903 | A | * | 3/1998  | Kerzman et al.  | 716/2  |
| 5,732,246 | A |   | 3/1998  | Gould et al.    |        |
| 5,761,483 | A |   | 6/1998  | Trimberger      |        |
| 5,847,580 | A |   | 12/1998 | Bapat et al.    |        |
| 5,850,537 | A |   | 12/1998 | Selvidge et al. |        |
| 5,936,424 | A |   | 8/1999  | Young et al.    |        |
| 5,948,089 | A |   | 9/1999  | Wingard et al.  |        |
| 6,067,650 | A | * | 5/2000  | Beausang et al. | 714/726|
| 6,182,183 | B1|   | 1/2001  | Wingard et al.  |        |

(Continued)

FOREIGN PATENT DOCUMENTS

WO    00/22961 A    5/2000

OTHER PUBLICATIONS

T. Minerd, *Time Division Multiplexed Bus for Machine Control*, IEEE Industry Applications Magazine, pp. 50-56, May/Jun. 1997, (7 pages).

(Continued)

*Primary Examiner*—Paul Dinh
*Assistant Examiner*—Patrick Sandoval
(74) *Attorney, Agent, or Firm*—Rutan & Tucker, LLP

(57) ABSTRACT

Methods and apparatuses for optimizing distributed multiplexed bus interconnects are described. Parameters of components that make up a distributed multiplexed bus interconnect may be optimized, such as an amount of area on a chip occupied by the component, an amount of power consumed by the component, etc., while satisfying existing timing constraints between nodes of a distributed multiplexed bus interconnect.

19 Claims, 20 Drawing Sheets

U.S. PATENT DOCUMENTS

| | | | | |
|---|---|---|---|---|
| 6,272,668 | B1* | 8/2001 | Teene | 716/10 |
| 6,330,225 | B1 | 12/2001 | Weber et al. | |
| 6,360,356 | B1* | 3/2002 | Eng | 716/18 |
| 6,487,705 | B1* | 11/2002 | Roethig et al. | 716/6 |
| 6,523,156 | B2* | 2/2003 | Cirit | 716/9 |
| 6,665,851 | B1* | 12/2003 | Donelly et al. | 716/8 |
| 6,678,645 | B1* | 1/2004 | Rajsuman et al. | 703/20 |
| 6,683,474 | B2 | 1/2004 | Ebert et al. | |
| 6,701,289 | B1* | 3/2004 | Garnett et al. | 703/14 |
| 6,721,924 | B2* | 4/2004 | Patra et al. | 716/2 |
| 6,772,399 | B2* | 8/2004 | Saluja et al. | 716/2 |
| 6,880,133 | B2* | 4/2005 | Meyer et al. | 716/1 |
| 6,910,200 | B1* | 6/2005 | Aubel et al. | 716/9 |
| 6,910,202 | B2* | 6/2005 | Minami et al. | 716/18 |
| 7,039,881 | B2* | 5/2006 | Regan | 716/3 |
| 7,055,121 | B1* | 5/2006 | Bolander et al. | 716/11 |

OTHER PUBLICATIONS

P. G. Paulin et al., *A Multi-paradigm Approach to Automatic Data Path Synthesis*, 23$^{rd}$ Design Automation Conference, pp. 587-594, Jun. 1988, (8 pages).

K. Choi et al., *A Flexible Datapath Allocation Method for Architectural Synthesis*, ACM Transactions on Design Automation of Electronic Systems, vol. 4, No. 4, pp. 376-404, Oct. 1999, (29 pages).

U.S. Appl. No. 09/634,045, filed Aug. 2, 2000, Wingard et al.

Supplementary European Search Report, EP 03726871, mailed Mar. 6, 2008, 4 pp.

Wingard D Ed-Institute of Electrical and Electronics Engineers/Association For Computing Machinery: "Micronetwork-based integration for SOCs" Proceedings of the 38TH. Annual Design Automation Conference. (DAC). Las Vegas, NV, Jun. 18-22, 2001, Proceedings of the Design Automation Conference, New York, NY: ACM, US, vol. Conf. 38, Jun. 18, 2001, pp. 673-677, XP010552471 ISBN: 1-58113-297-2 abstract; p. 673, right column, last paragraph-p. 674, left column, second paragraph; section 3.5.

Wingard D et al: "Integration Architecture For System-On-A-Chip Design" Proceedings of the IEEE 1998 Custom Integrated Circuits Conference. CICC '98. Santa Clara, CA, May 11-14, 1998, Annual Custom Integrated Circuits Conference, New York, NY: IEEE, US, vol. Conf. 20, May 11, 1998, pp. 85-88, XP000900331 ISBN: 0-7803-4293-3 abstract; p. 86, right column, first paragraph; p. 87, right column, last paragraph; p. 88, left column, second paragraph; p. 88, right column, lines 3-11.

Guerrier P et al: "A Generic Architecture for On—Chip Packet—Switched Interconnections" ACM, Mar. 27, 2000, pp. 250-256, XP01377472 abstract; section 1; p. 252, left column, second paragraph; table 3, right column.

Ho R et al: "The future of wires" Proceedings of the IEEE IEEE USA, vol. 89, No. 4, Apr. 2001, pp. 490-504, XP002469158 ISSN: 0018-9219 abstract; p. 495, right column, second and third paragraph; p. 495, right column, last line—p. 496, left column, last but one paragraph; p. 501, left column, lines 12-13.

Michael Keating, Pierre-Bricaud: "Reuse Methodology Manual for System—on—a—Chip Designs" Kluwer Academic Publishers, Second Edition, 2000, p. 28-43, 115-123, 206-228, XP002469762* the whole document.

* cited by examiner

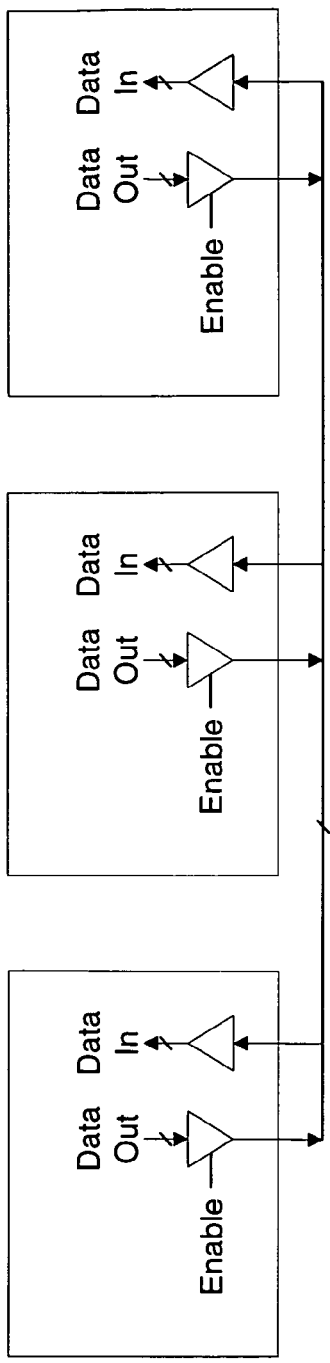
Figure 1A: Tri-State Bus (Prior Art)
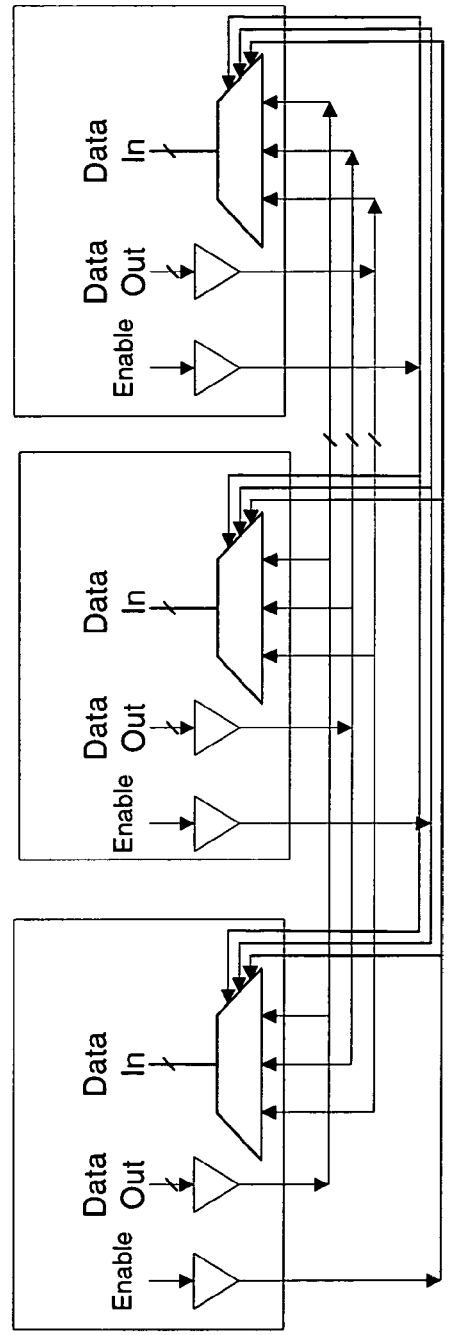
Figure 1B: Multiplexed Bus (Prior Art)

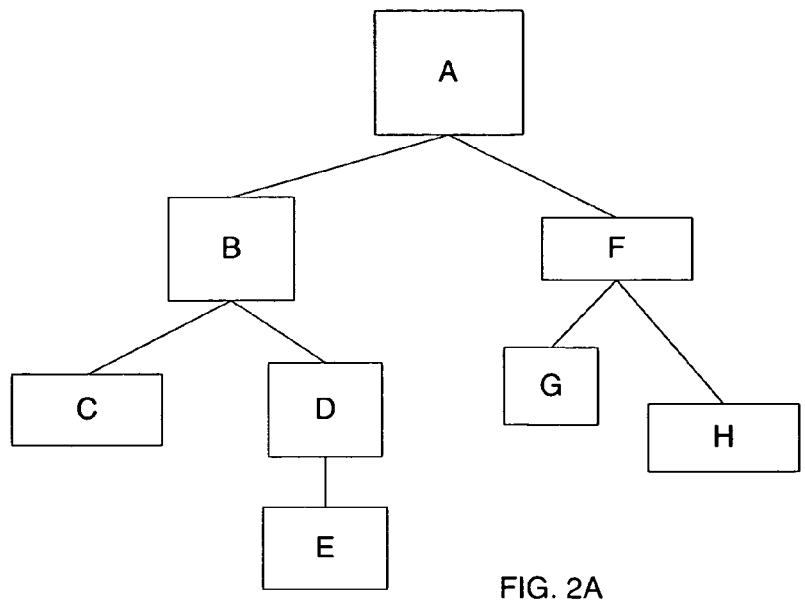
FIG. 2A
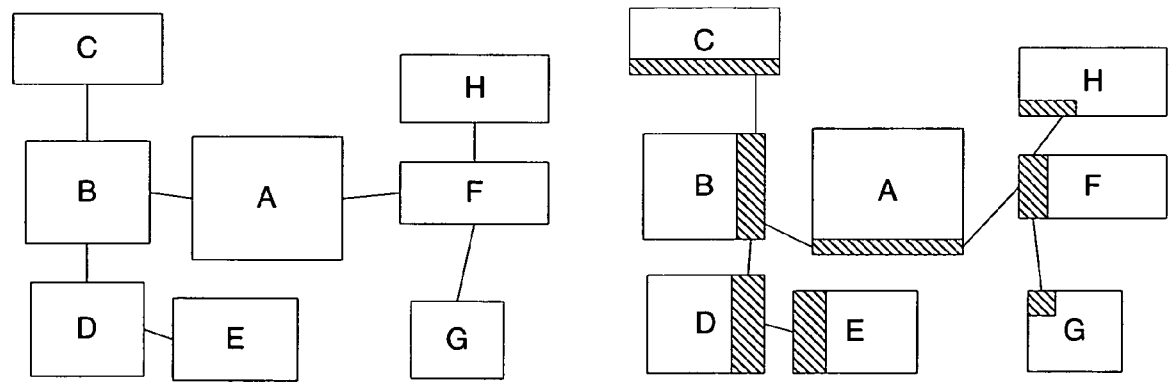
FIG. 2B
FIG. 2C

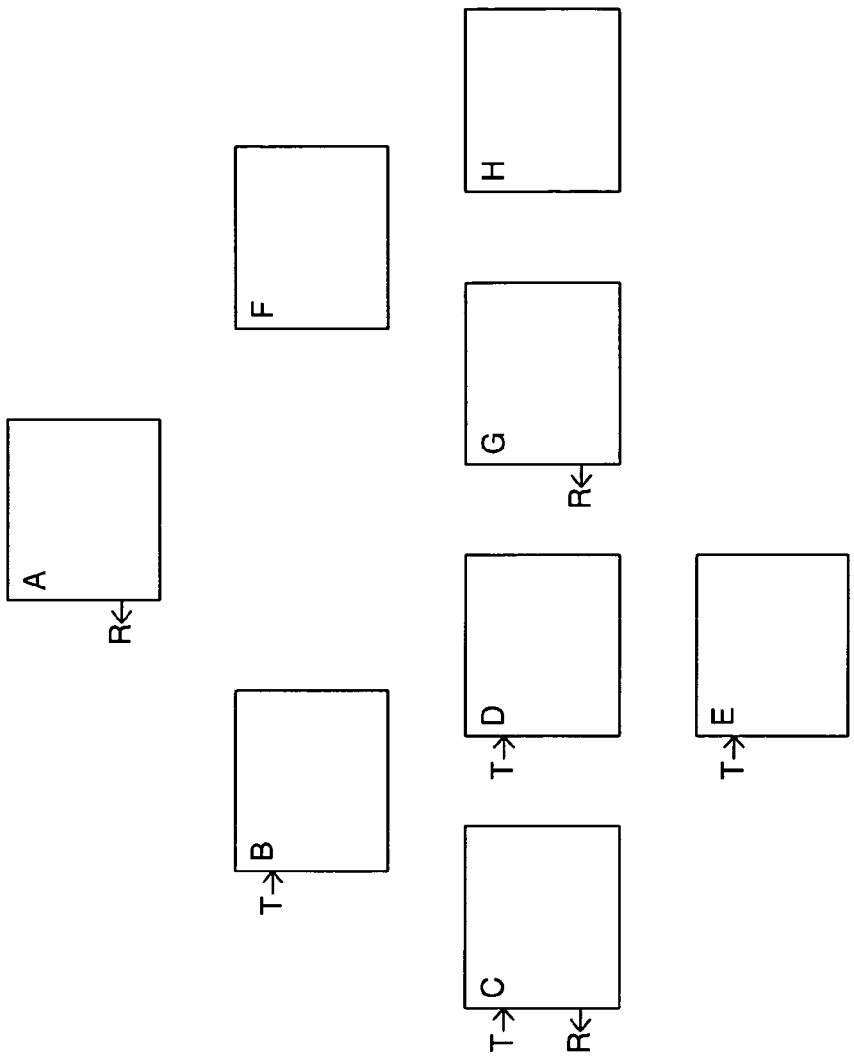

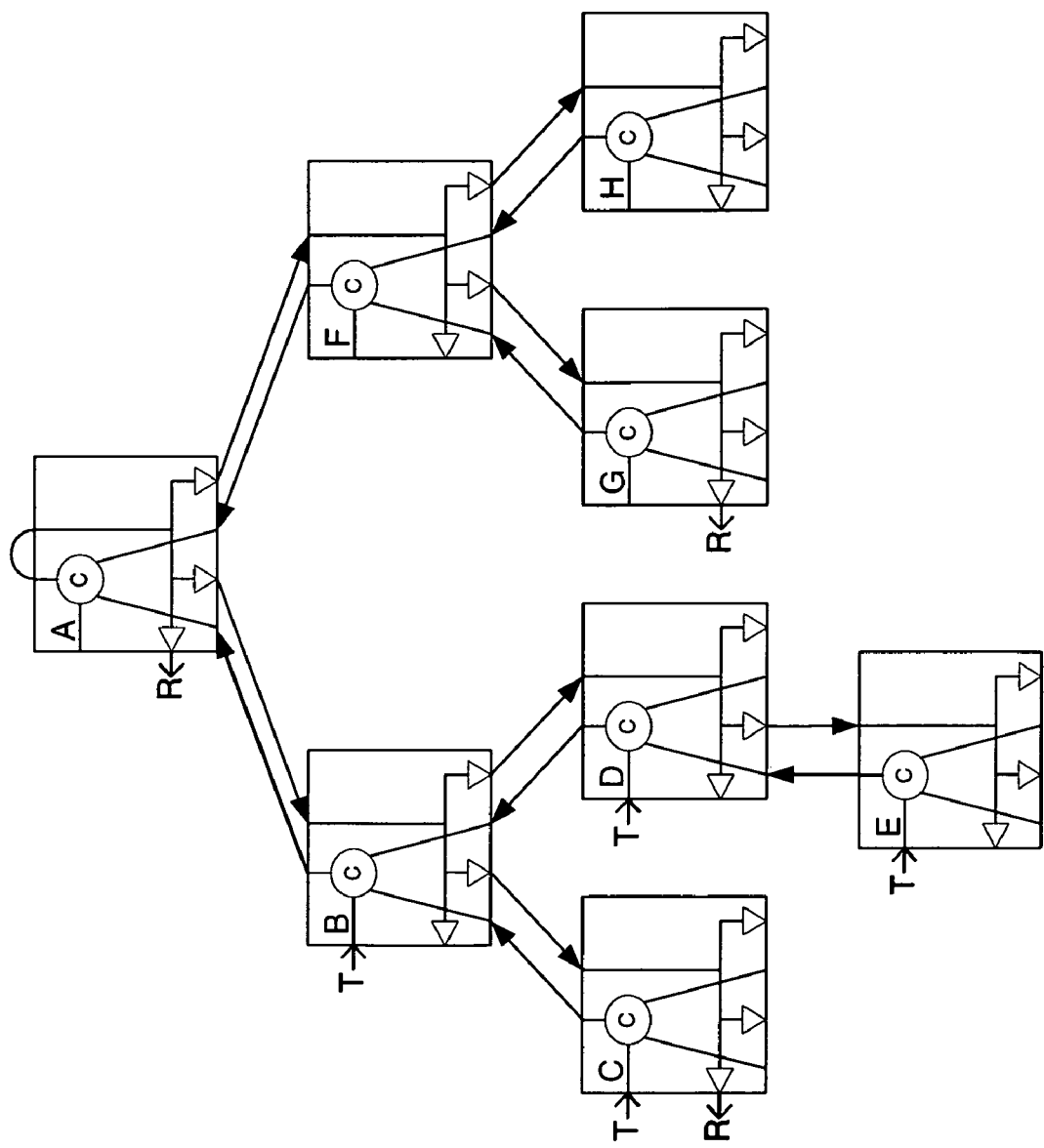
Figure 3B: Unoptimized connections for mux_tree A{BC{DE0}}{FGH}

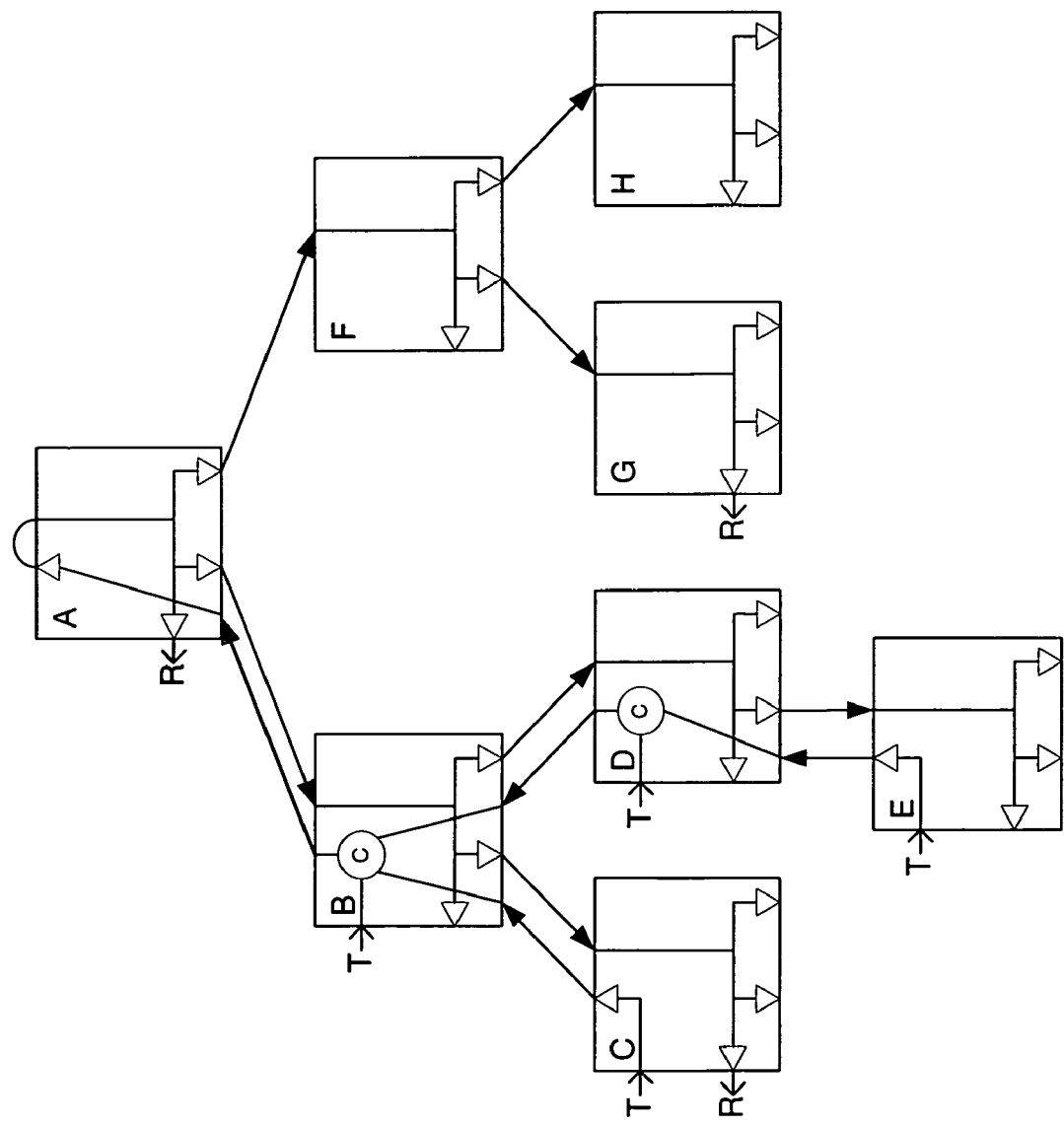
Figure 3C: After combiner optimization

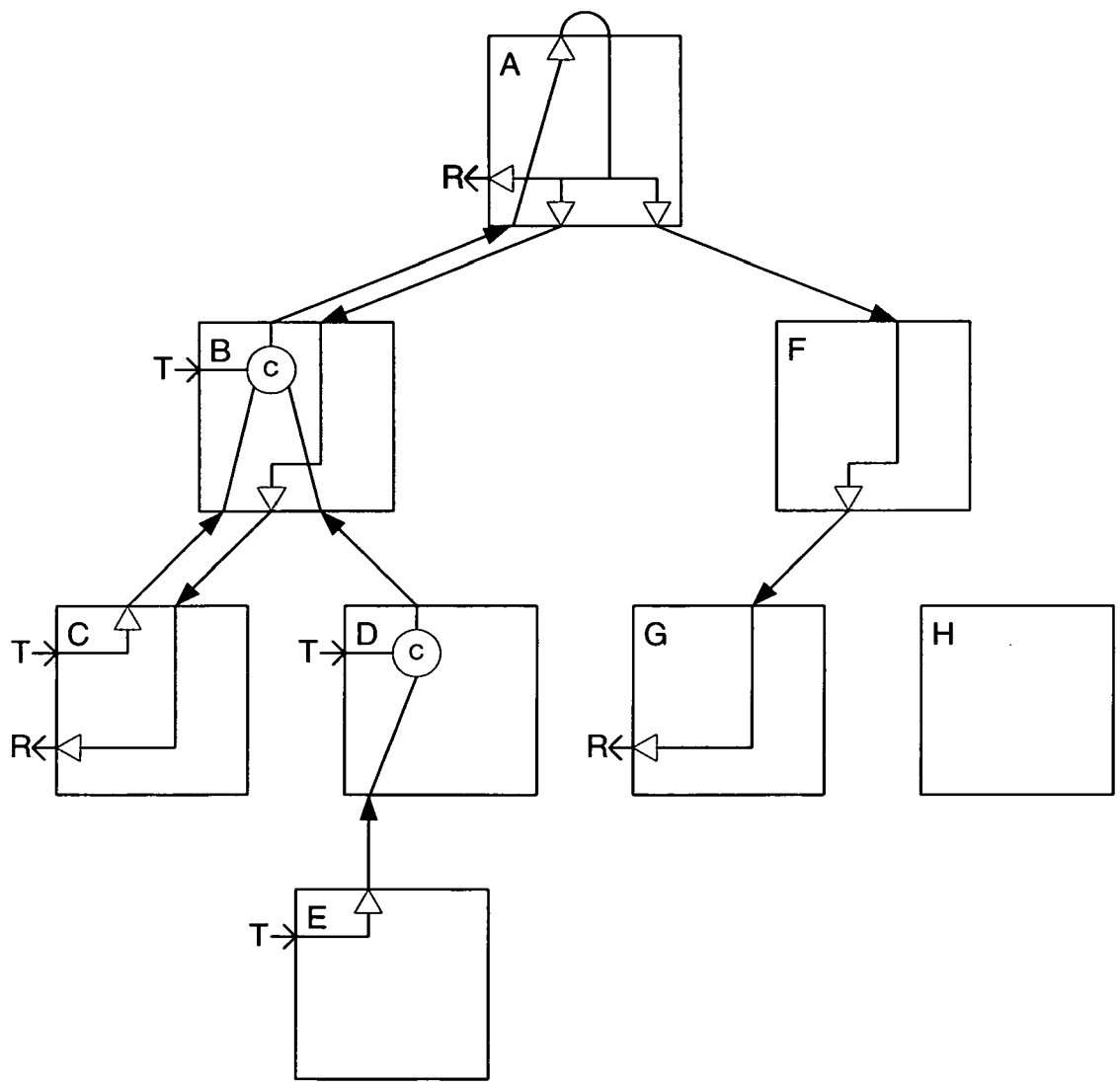
Figure 3D: After repeater optimization

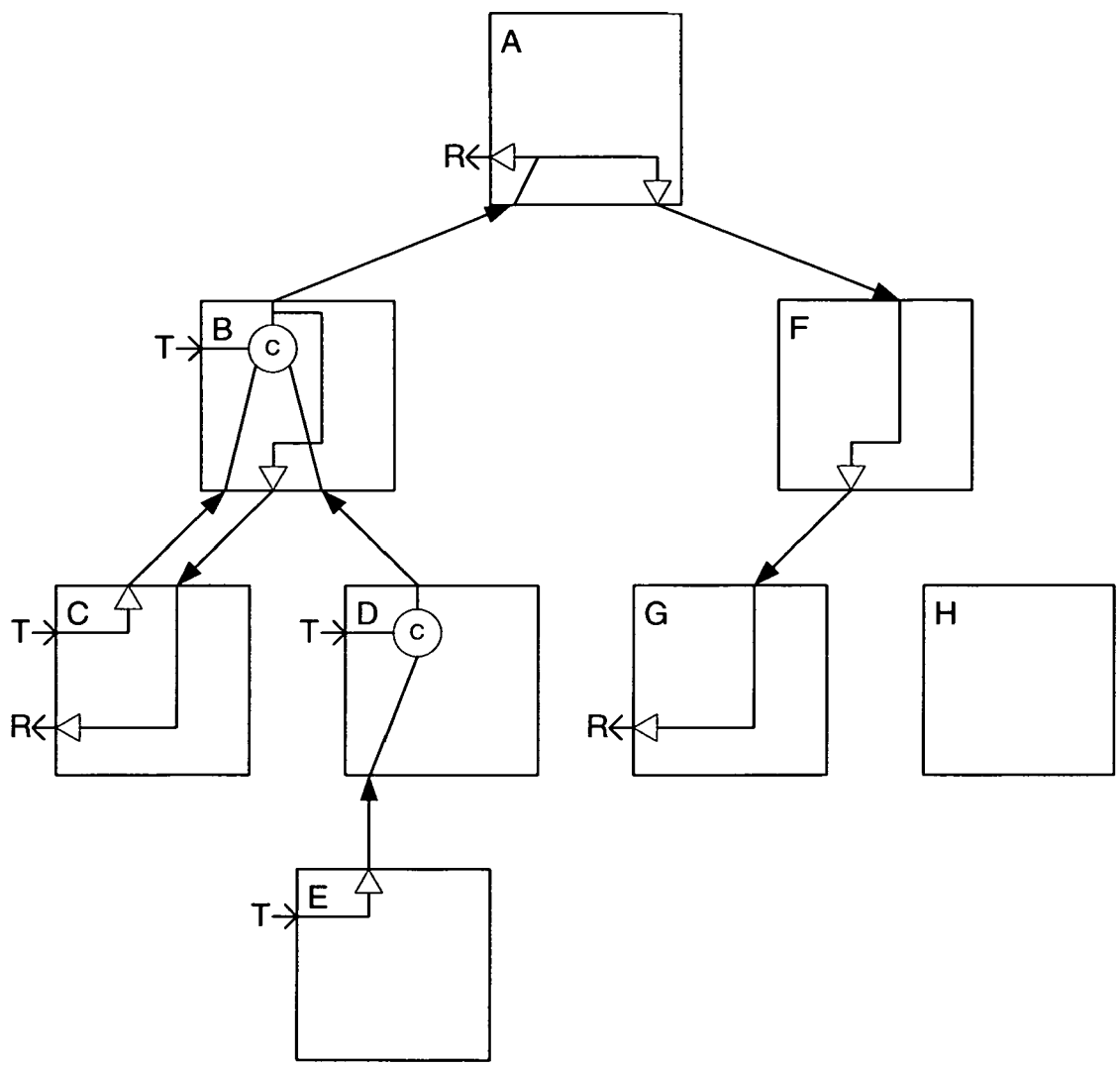
Figure 3E: After root optimization

Path A B D E F is a critical path and required to meet clock period.
Path A B C is much shorter but segment A must still meet timing requirement. Can only scale segment C.

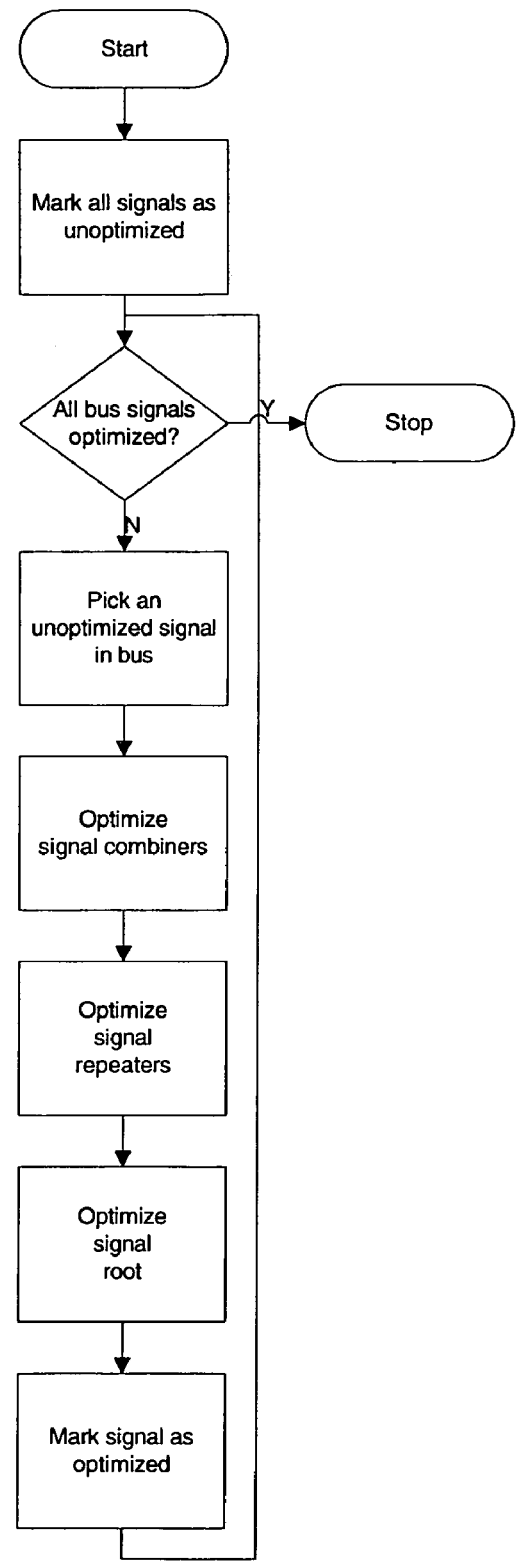
Figure 6A: Flowchart for Optimizing Bus Signal Wiring

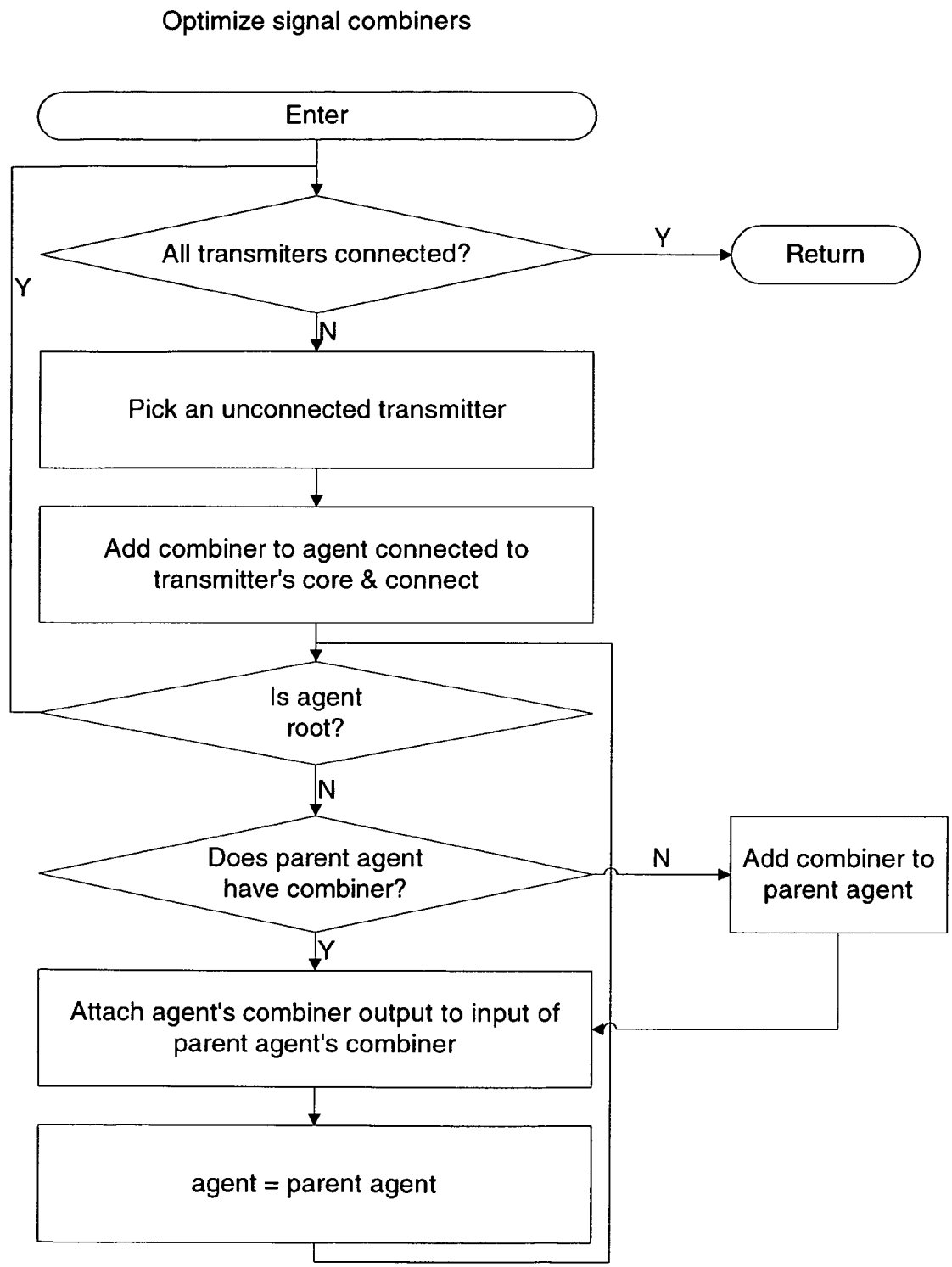
Figure 6B: Flowchart for Optimizing Combiners

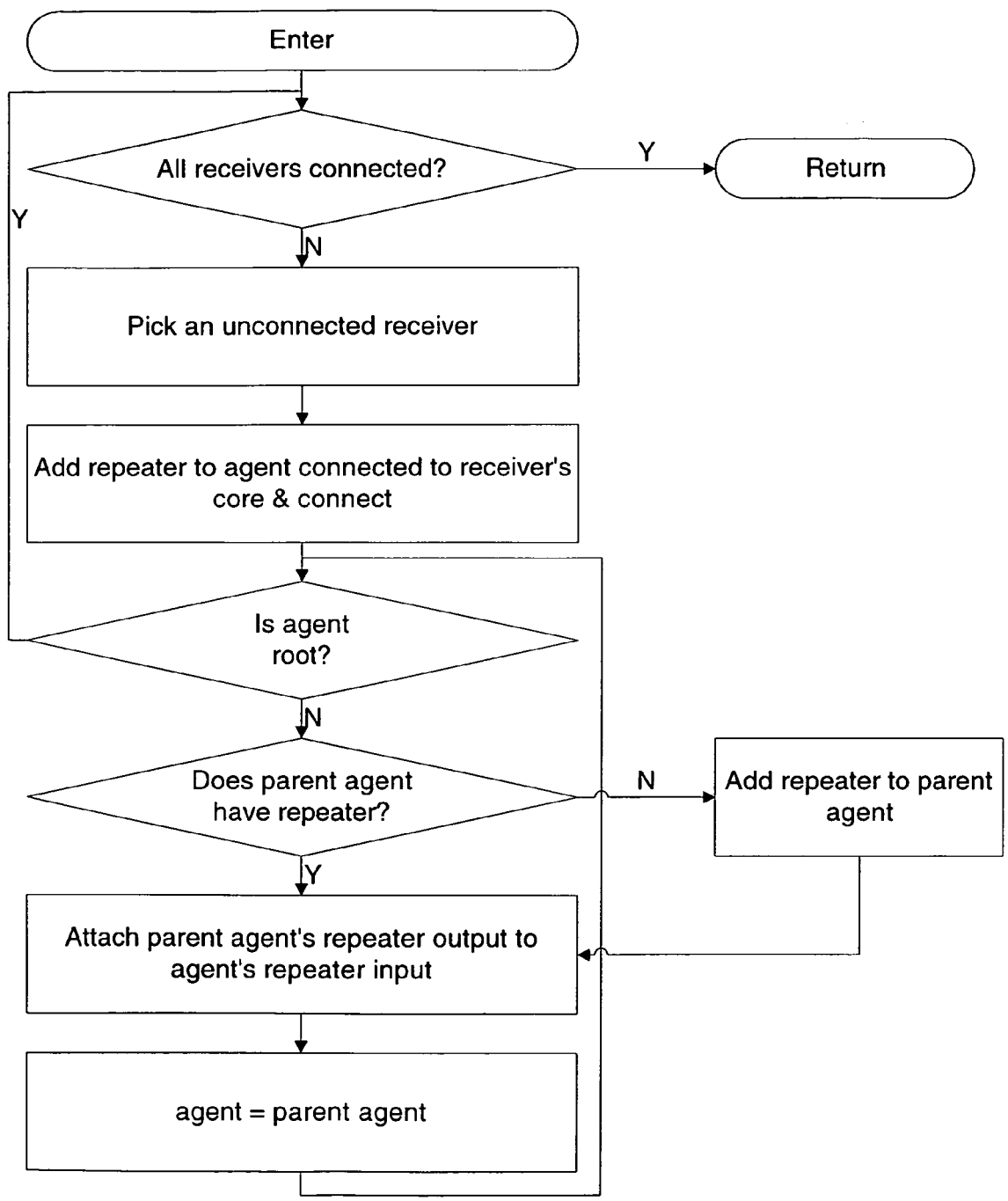
Figure 6C: Flowchart for Optimizing Repeaters

Optimize signal root
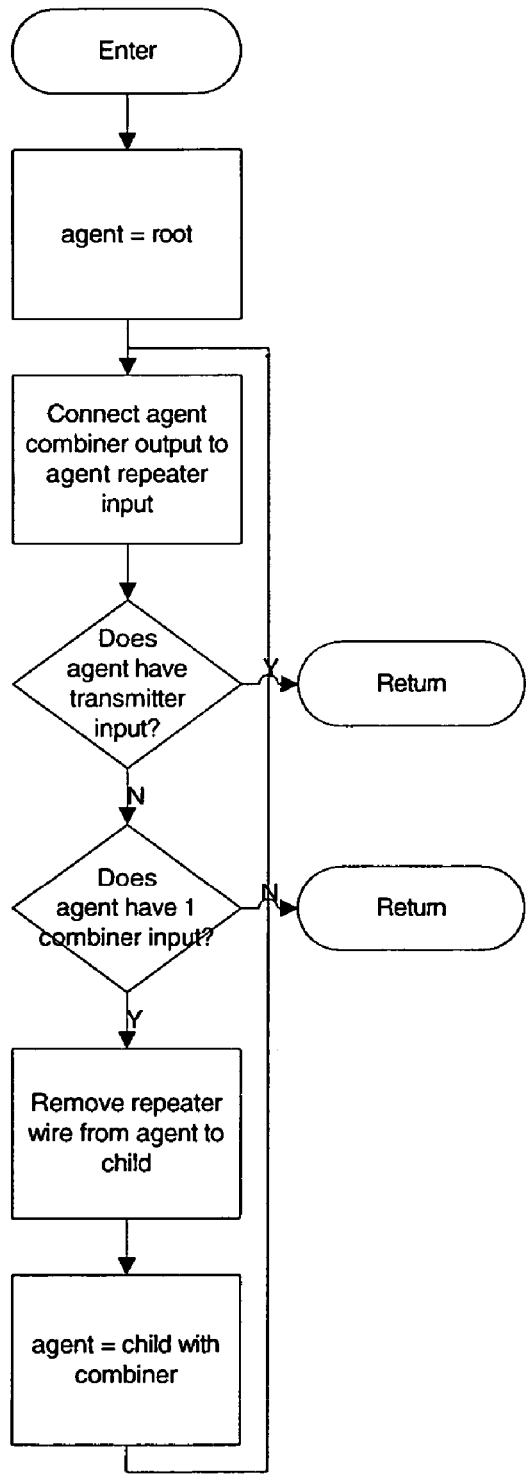
Figure 6D: Flowchart for Optimizing Root

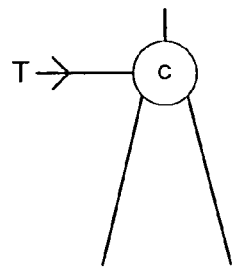
Figure 7A: The combiner block
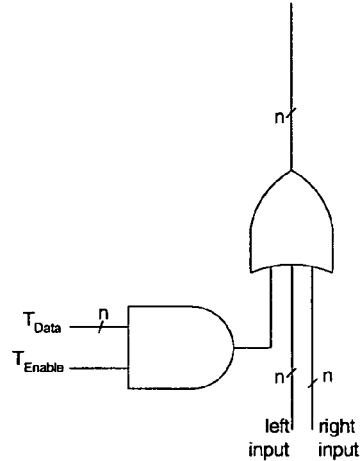
Tenable is a sing bit
while other a n-bit signals.
Figure 7B: Details of the combiner block
| Tenable | left input | right input | bus state |
|---------|------------|-------------|-------------|
| 0 | 0 | 0 | No conflict |
| 1 | !=0 | X | Conflict |
| 1 | X | !=0 | Conflict |
| X | !=0 | !=0 | Conflict |
Table 1: Conflict Detection
Figure 7C Flowchart for optimizing timing constraints Trace Paths

METHOD AND APPARATUS FOR OPTIMIZING DISTRIBUTED MULTIPLEXED BUS INTERCONNECTS

RELATED APPLICATIONS

This application is a divisional application of and claims the benefit of U.S. application Ser. No. 10/146,989 filed May 15, 2002, which will issue as U.S. Pat. No. 6,880,133 on April 12, 2005.

FIELD OF THE INVENTION

The present invention pertains to interconnections. More particularly, the present invention relates to a method and apparatus for optimizing distributed multiplexed bus interconnects.

BACKGROUND OF THE INVENTION

In computer networks, internetworking, communications, integrated circuits, etc. where there is a need to communicate information, there are often interconnections established to facilitate the transfer of the information. One approach is to use dedicated communication "lines" or links to transfer the information. A bus is usually used when more than two devices need to communicate. A traditional way to implement buses is using tristate bus drivers, where one device drives the bus and other drivers are disabled. Another approach is to have each device use a different set of wires and then to use a multiplexer to select the set of wires of the enabled device.

However, in multiplexing a bus, there may be communication points that may not need the full capabilities of the bus. Thus, extending a full bus to these entities may be wasteful of resources, such as space, power, etc. This may present a problem.

BRIEF DESCRIPTION OF THE DRAWINGS

The present invention is illustrated by way of example and not limitation in the figures of the accompanying drawings, in which like references indicate similar elements and in which:

FIG. 1A and FIG. 1B illustrate traditional buses;

FIG. 2A, FIG. 2B, and FIG. 2C illustrate embodiments of the present invention showing a topology;

FIG. 3A illustrates one embodiment of the present invention showing receivers and transmitters for a specific bus signal;

FIG. 3B illustrates one embodiment of the present invention showing unoptimized connections;

FIG. 3C illustrates one embodiment of the present invention showing a topology after a combiner optimization;

FIG. 3D illustrates one embodiment of the present invention showing a topology after a repeater optimization;

FIG. 3E illustrates one embodiment of the present invention showing a topology after a root optimization;

FIG. 6A illustrates one embodiment of the present invention showing a flowchart for optimizing bus signal wiring;

FIG. 6B illustrates one embodiment of the present invention showing a flowchart for optimizing combiners;

FIG. 6C illustrates one embodiment of the present invention showing a flowchart for optimizing bus repeaters;

FIG. 6D illustrates one embodiment of the present invention showing a flowchart for optimizing the root;

FIG. 7A illustrates one embodiment of the present invention showing a combiner block;

FIG. 7B illustrates another embodiment of the present invention showing a combiner block in more detail;

FIG. 7C illustrates one embodiment of the present invention showing a truth Table 1 for checking bus conflicts;

DETAILED DESCRIPTION

Figure 4A:
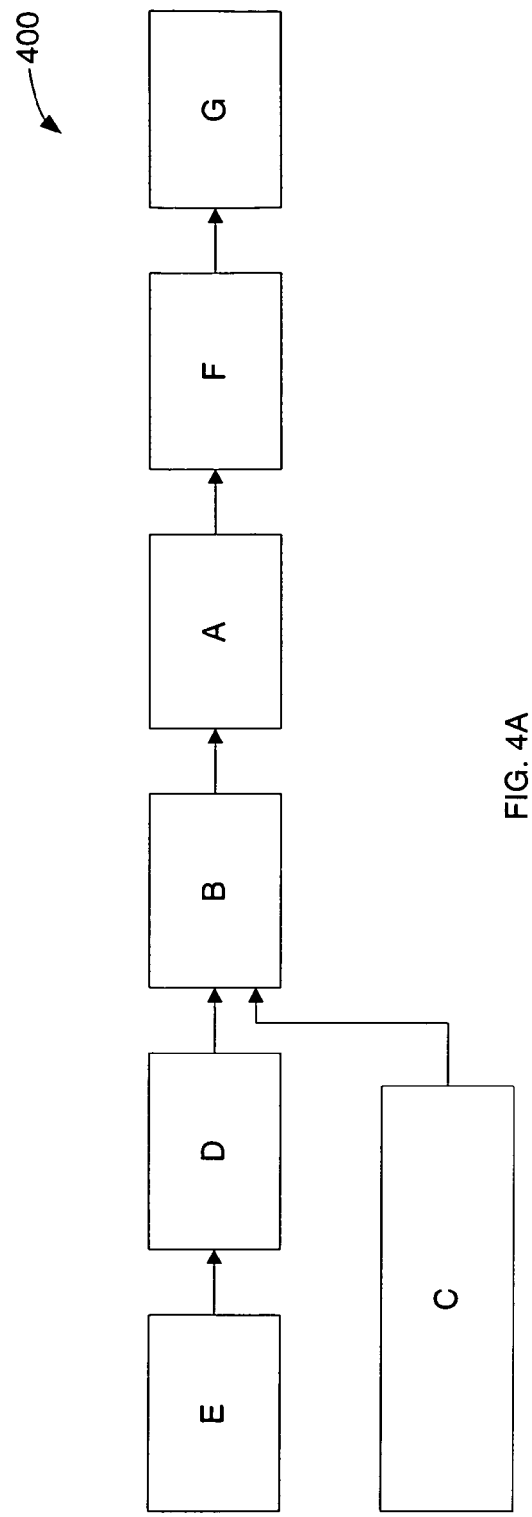
FIGS. 4A and 4B illustrate embodiments of the present invention showing interconnects and logic details.

A method and apparatus for optimizing distributed multiplexed bus interconnects are described.

The term IP as used in this document denotes Intellectual Property. The term IP, may be used by itself, or may be used with other terms such as core, to denote a design having a functionality. For example, an IP core or IP for short, may consist of circuitry, buses, communication links, a microprocessor, etc. Additionally, IP may be implemented in a variety of ways, and may be fabricated on an integrated circuit, etc.

Buses have traditionally been thought of as a string of blocks or connectors connected in a manner shown in FIG. 1A or FIG. 1B. This approach is simple and easy to implement. In Integrated Circuit (IC) design three-state (tri-states) (FIG. 1A) may not be desirable because of the difficulty in adding repeaters to wires that have multiple drivers and buses are commonly implemented via multiplexers. A multiplexer implementation requires a wire from each transmitter to each receiver, which may create a potential for wiring congestion. Another approach is to implement distributed multiplexers, where logic at each block merges signals from other blocks and then possibly fewer wires to the next device. Traditionally bus implementations have either assumed that signals on a bus are a receiver, transmitter, or a transceiver.

Describing a distributed multiplexed bus topology may be done in a variety of ways. For simple linear topology a list can express the order blocks are connected. However, for more complex topologies where more than one node are merged at any node a tree is a better way to describe the topology. The user may describe the topology of a bus in a parse-tree like syntax, such as:

```
mux_tree <sub-tree>
<sub-tree> ::= <root> <branch> <branch>
<root> ::= <instance-name>
<branch> ::= { <sub-tree> }
    | <instance-name>
    | 0    (a sentinel to indicate no connection)
```

An example tree might be:

mux_tree A { B C { D E } } { F G H }

This line above describes the connectivity between blocks that topologically looks like FIG. 2A. When the design is implemented in an IC, the blocks may appear as blocks in FIG. 2B. Each node in the tree may communicate with an IP core, optionally a parent node, and optionally a set of child nodes. Each node consists of an IP core and an agent as shown in FIG. 2C. The distributed multiplexer (and potentially other functions) may be implemented in the agent. Depending on how the multiplexed bus is connected, the agents may need to be changed, however the core may be unaffected. This may enable reuse of a core without having to change it when the bus changes. FIG. 3A shows the receivers and transmitters for each agent in this example. For this signal of the bus in this example Agents A, C and G need to receive the signal, while Agents B, C, D, and E may transmit it. There may be additional logic in the agent to perform other protocol conversion between these receiver and transmitter interfaces and an actual IP core. Given this transmitter and receiver configuration and the mux_tree specification described above, the agents are wired together as shown in FIG. 3B. Note that the output of the mux tree root is connected back to the mux tree root repeater input. The combiner function (FIG. 7A) takes as input data an enable from the core or other agent logic and the combiner output of the sub trees. FIG. 7B shows the "and-or" implementation of the combiner.

A tree structure may result in less wiring and/or shorter end-to-end paths than the simple linear wiring. The structure may be specified by the user and/or a program may find the minimal spanning tree. By routing signals using the same topology it may be possible to create predictable wiring delay and/or reduce congestion. Two sets of wires are used between two topologically adjacent nodes: the first may be used to combine the results, and the second may be used to distribute the result back to all nodes.

Optimizing signal wiring in a distributed multiplexed bus may be done by examining nodes. For example, some nodes may not generate (transmit) certain signals, while other nodes may not use (receive) certain signals. Routing all signals to all nodes may require more wiring and may increase the end-to-end path length for a signal. By removing combining wires from nodes that do not drive the signal and/or the distribution wires to nodes that do not use the result may allow a reduction in the area by requiring fewer drivers and/or less wire, potentially improving chip timing by shortening critical paths, and/or reducing power by using smaller drivers to achieve the same timing.

FIG. 6A illustrates one embodiment of the present invention of a high level algorithm for optimizing bus signal wiring. Note that the sequence need not be performed in a specific order, however the illustrated order is easy to implement. Each signal is analyzed and unnecessary transmitters and receivers are removed. Signals in the bus are optimized individually since each signal may have different transmitters and receivers topologies based on the core function and the bus protocol. The algorithm for removing these unnecessary wires is given below: Given a tree with a root and a list of bus_signals:

```
foreach signal in bus_signals {
    optimize_combiners(root,signal);
    optimize_repeaters(root,signal);
    optimize_root(root,signal);
}
```

The removal of unnecessary combiners may reduce the amount of wiring used to connect blocks at the top level of the chip and/or may shorten the path of some signals so they may be better optimized for timing, area, power, etc. The optimization of the combiners, in one embodiment of the present invention, may be done by a bottom up removal of unnecessary combiners for a specific signal. A combiner is unnecessary in an agent if the core attached to the agent and other agent logic does not have a transmitter and none of the children in the sub-tree have a combiner. FIG. 6B illustrates in a flow chart, one embodiment of the present invention for optimizing the insertion of combiners. The optimization of combiners may be either additive as shown in FIG. 6B, and/or subtractive as shown in the recursive algorithm as is given below:

```
procedure optimize_combiners(sub_tree,signal) {
    has_combiner = node_needs_combiner(sub_tree.node,signal)
    foreach child in sub_tree.children
        if (optimize_combiners(child,signal)) {
            has_combiner = true
        }
    if (!has_combiner)
        remove_combiner(sub_tree.node,signal)
    return has_combiner
}
```

FIG. 3C illustrates the effect of optimizing combiners. Combiners have been removed from agents F, G, and H. If a combiner has one input, then the "or" function can be replaced by a buffer if the input is from a sub-tree or a combiner's "and" of the data and enable.

Unused repeaters may be optimized by removal of unnecessary repeaters for a specific signal. This may have timing, area, power, etc. benefits. A repeater is unnecessary for an agent if the core attached to the agent and other logic in the agent does not have a receiver and none of the children in the sub-tree have a repeater. FIG. 6C illustrates a flowchart, for one embodiment of the present invention, for adding repeaters to the mux tree. The repeater optimization process may be additive as shown in FIG. 6C, and/or it may be subtractive as show in the algorithm below:

```
procedure optimize_repeaters(sub_tree,signal) {
    has_repeater = node_needs_repeater(sub_tree.node,signal)
    foreach child in sub_tree.children
        if (optimize_repeaters(child,signal)) {
            has_repeater = true
        }
    if (!has_repeater)
        remove_repeater(sub_tree.node,signal)
    return has_repeater
}
```

FIG. 3D illustrates the effect of optimizing repeaters. Repeaters have been removed from agents D, E and H.

If all the transmitters are in one sub-tree, then wires from the root of the entire tree to the root of that sub-tree used for returning the result may be removed as this node can drive the result directly to the sub-tree and to the root. FIG. 6D illustrates the flowchart for optimizing the root for a signal, while example pseudo-code is given below:

```
procedure optimize_root(sub_tree,signal) {
    if node_needs_transmitter(sub_tree,signal)
        connect_combiner_to_repeater(sub_tree.root);
        return;
    new_root = NULL
    foreach child in sub_tree.children {
        if (node_needs_transmitter(child,signal)) {
            if (new_root != NULL) {
                return;
            }
            new_root = child;
```

-continued

```
        }
    }
    if (new_root != NULL)
        optimize_root(child,signal)
}
```

FIG. 3E illustrates the effect of optimizing the root. In this example, the repeater wire connecting A and B has been removed and agent B acts as the root for this signal.

Figure 4B:
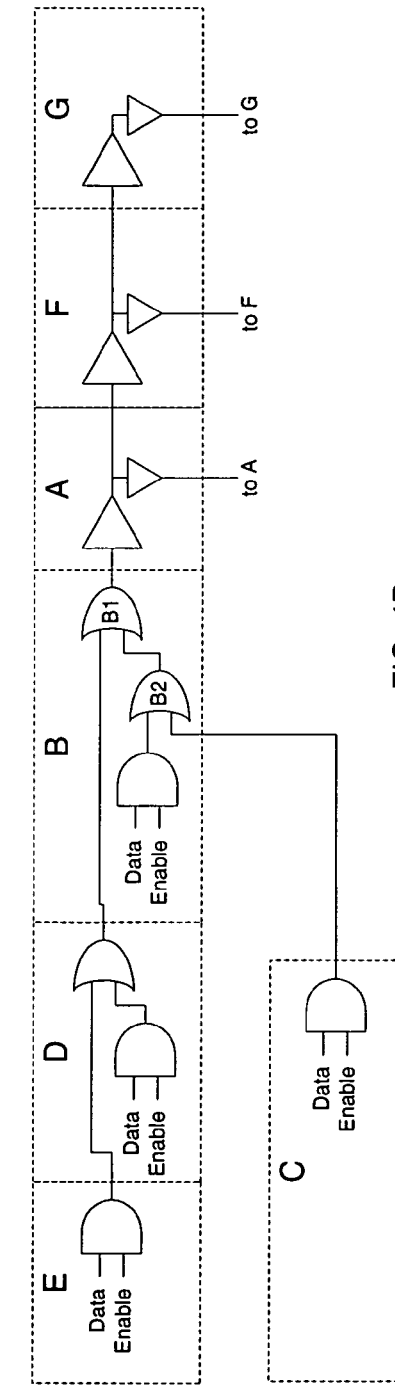
Figure 5:
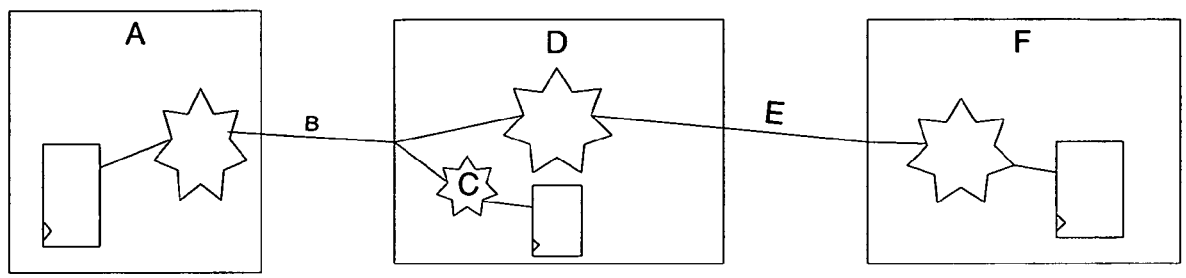
FIG. 5 illustrates one embodiment of the present invention showing timing paths.
Figure 8A:
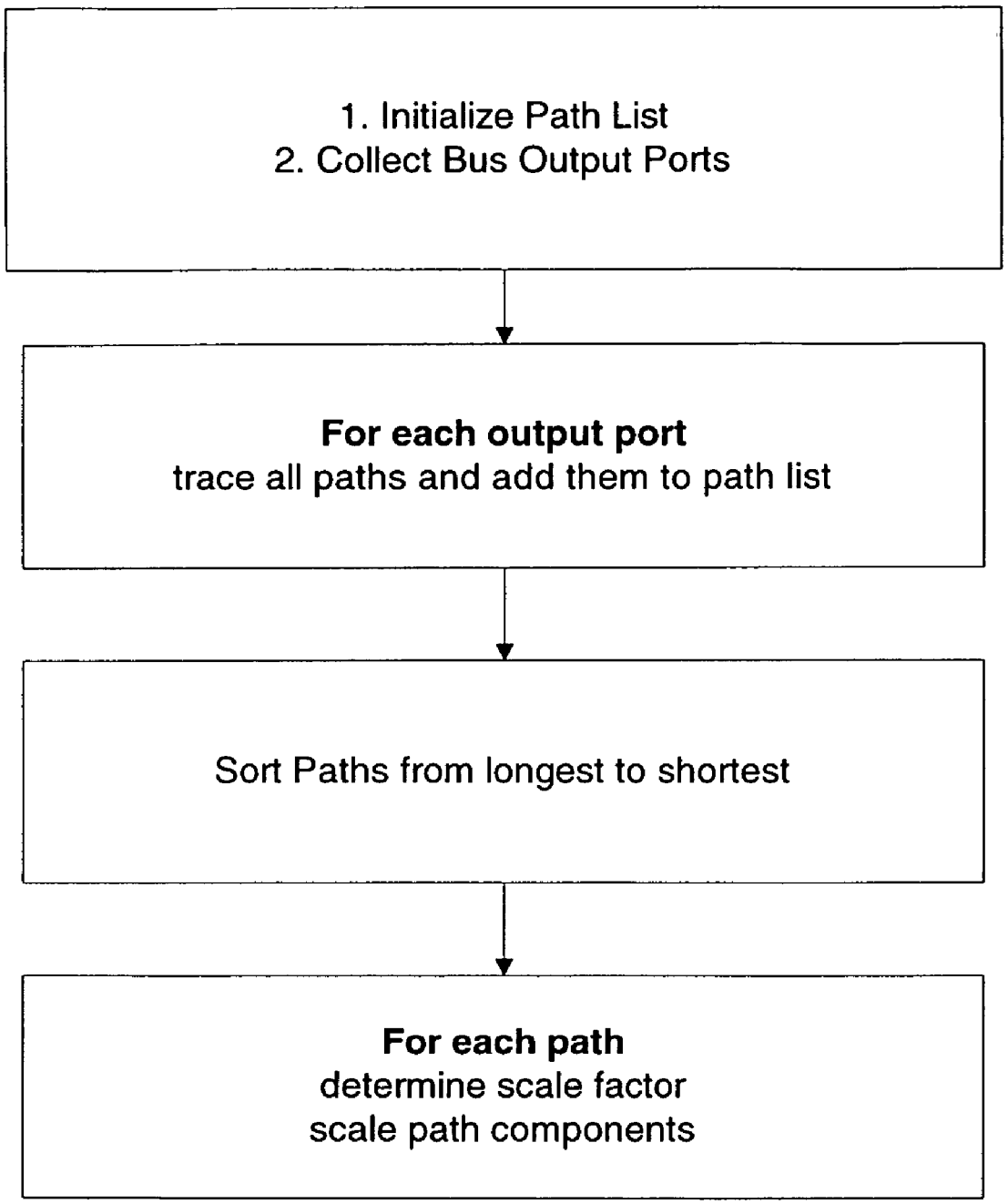
FIGS. 8A-8D illustrate various embodiments of the present invention showing optimizing timing constraints.
Figure 8B:
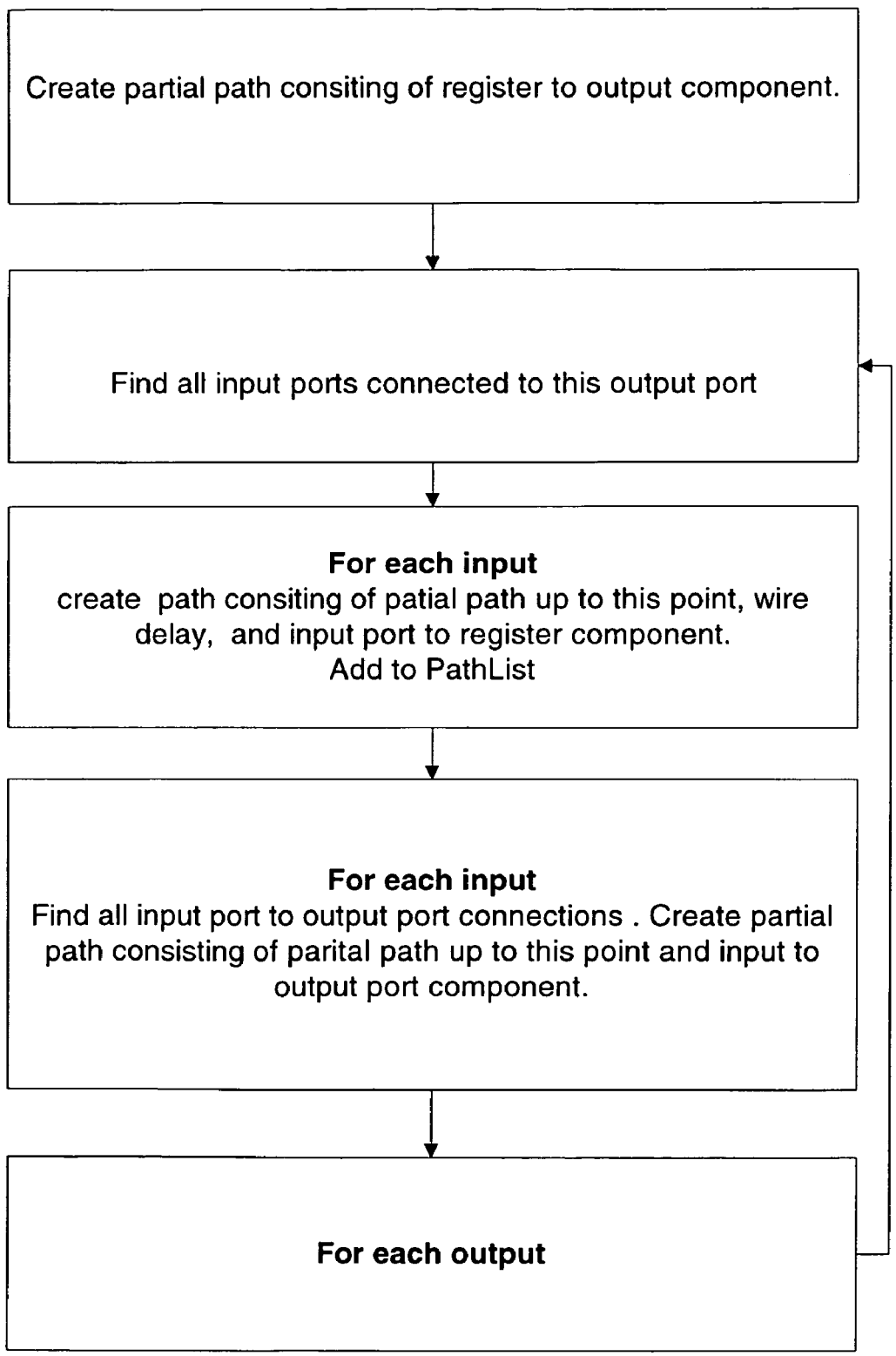
Figure 8C:
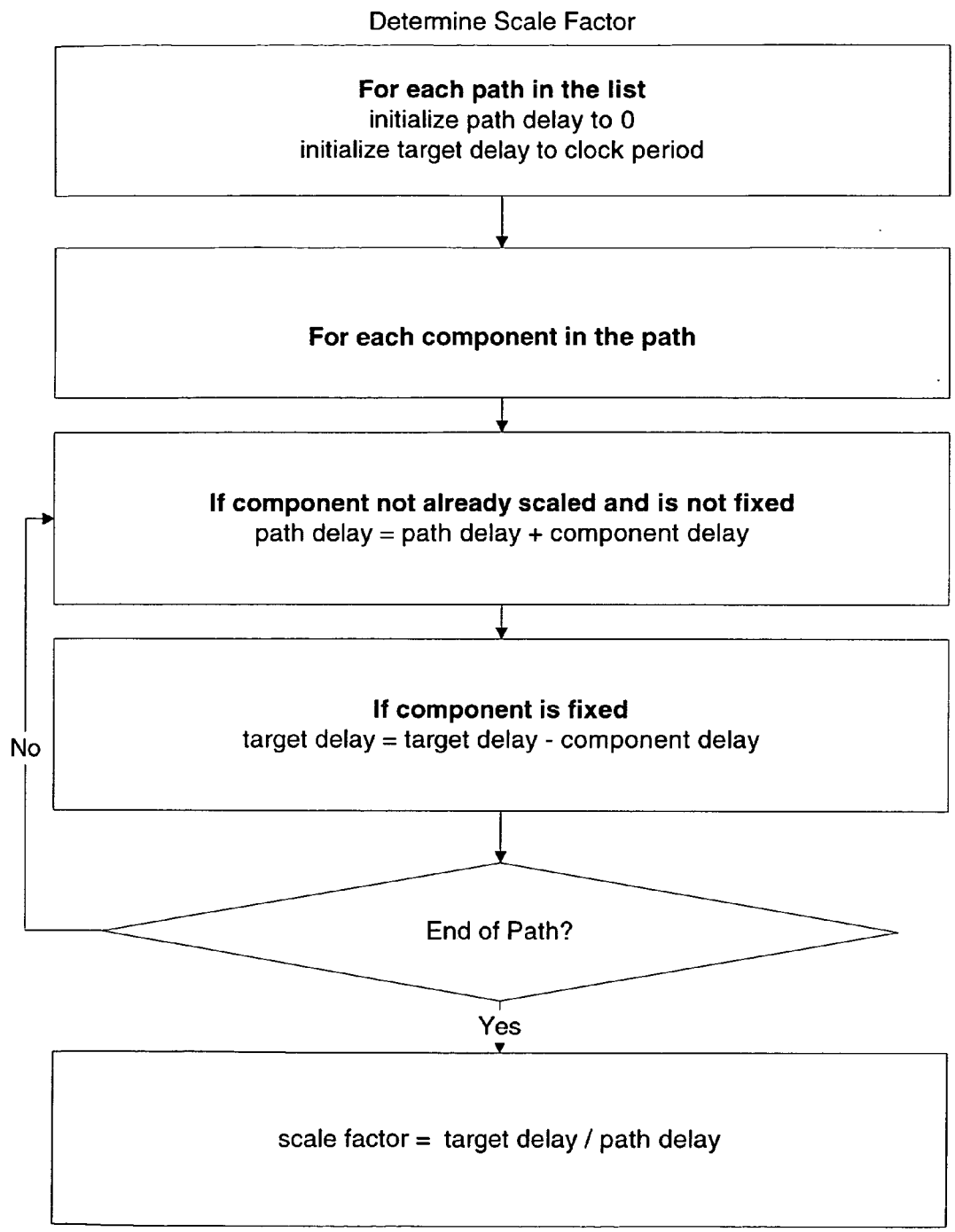
Figure 8D:
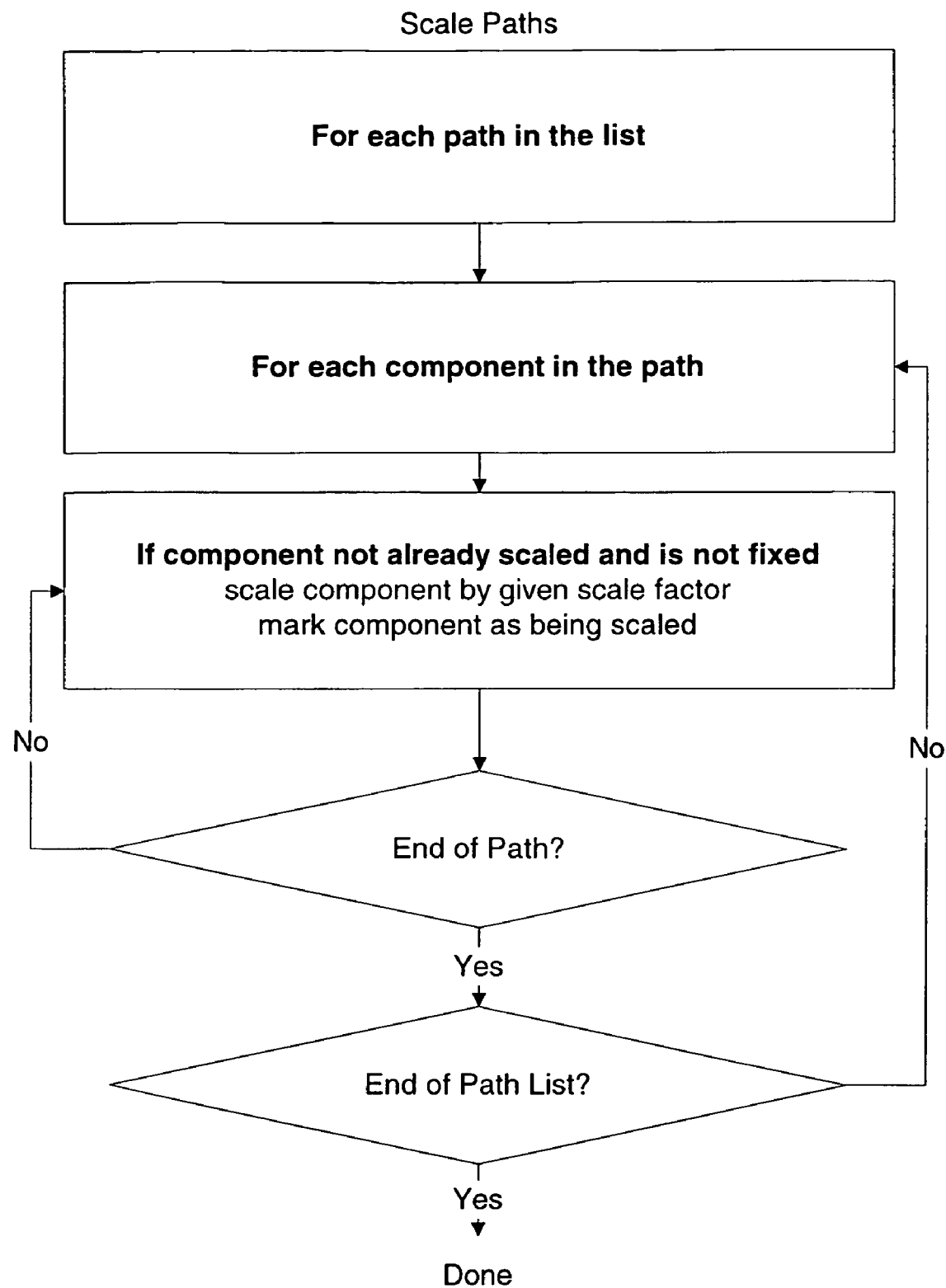

Optimizing the timing of the distributed multiplexed bus may result in the reduction of power, area, etc. Logic synthesis is a program that translates equations into optimized logic gates. In addition to the logic equations, synthesis may also accept constraints. Timing constraints can describe when inputs are available and when outputs are required. Logic synthesis tries to optimize the logic gates to best meet these constraints. In prior approaches, timing constraints may not have considered the position in the bus topology when generating constraints. This may lead to over-constraints and consequently a sub-optimal design in terms of area and/or power. One embodiment of the present invention considers the location of each agent in the bus topology when generating constraints. Constraints are generated after the signal wiring has been optimized. Based on prior characterization an estimate is made for each component of timing which makes up the overall bus delay. The components include those that are scalable and those that are fixed. The scalable components may include the register to bus output (FIG. 5-A), bus input to bus output (FIG. 5-C, F), and bus input to register delays (FIG. 5-E, H). The fixed components may be the delays due to wiring between an output and an input ports (FIG. 5-B, D, G) based on the location of the agents. Using these components a delay calculation can be done on all of the paths which compose the bus. Given a multiplexed bus topology shown in FIG. 4A, a multiplexed bus in FIG. 4-B will be used. Applying the above optimizations will result in the path from D to A through Bi being optimized for better timing than the logically equivalent path from C to A through B2. Additionally, the size of the driver in node C will be reduced because that path is less critical than the path starting from E.

FIGS. 8A-8D illustrate one embodiment of the present invention for optimizing the timing constraints. The delay calculation is done by searching all possible paths from an output port and adding up the timing components which make up the path. A list of each unique path is kept track of along with its overall delay. Each of the components of the path is stored in the list for the scaling process.

The next procedure is to scale each path to meet the timing required by the bus. Paths which exceed the timing are scaled down to meet it by calculating a scale factor which reduces each scalable timing component. Paths which have timing less than that required are scaled up to meet it by calculating a scale factor which increases each scalable timing component. Scaling proceeds by starting with the longest delay paths, applying the path specific scaling factor to each component and marking each component as scaled. This process continues for each path generated above. The ordering and marking is important so as not to increase the delay on a timing component required by a longer path. By allowing more time (scaling up the timing components) logic synthesis may be able to select slower cells, which are smaller and use less power. The end result may be less area and/or less power requirements for the overall design.

FIG. 5 illustrates the effect of this process. In this configuration the constraints for path A, B, C, D, E are looser because the timing on the path through A, B, C, D, F, G, H is a longer path. Consequently, logic synthesis will optimize the timing from G, H more than that from D,E.

Multiple simultaneous drivers of the same signal may be legal for certain signals (like an error or interrupt signal), but illegal for other signals (like address). Simulator are able to detect multiple simultaneous tri-state drivers when they are driving conflicting values (one driver driving a 1 and another driving 0) and generate an X to aid in detecting design errors. Detecting multiple drivers in a distributed multiplexed bus is difficult because the combining function ("and-or" for example) may not enable the simulator to catch this design error, and the distributed nature of its implementation may make it hard to add a single checker. Another approach is to distribute the checking in each combiner function of the distributed multiplexer.

An "or" implementation of an N-bit combiner verilog logic equation is given below:

Output=(core_input & {N{core_enable})
    ||left_input|right_input

A checker to detect conflicts can look for cases where the core is enabled (core_input is not zero) and either the left or right input is not zero. Additionally, if both the left input and the right input is not zero then, there are multiple drivers. Table 1 (FIG. 7C) gives the truth table for detecting bus conflict. The verilog logic equations for this are:

error=(Core_enable &&|(left_input|right_input))||
    (|left_input|||right_

This may not catch the case where multiple cores are driving zero, however, the probability of this for multi-bit signals is relatively low, so this check is nearly as good as the more complicated check of all of the core enable signals. This can then be used to stop the simulation and report a design error as shown below:

```
if (error) begin
    $display("multiple drivers");
    $finish;
end
```

Thus, what has been disclosed is a method and apparatus for optimizing distributed multiplexed bus interconnects.

Figure 9:
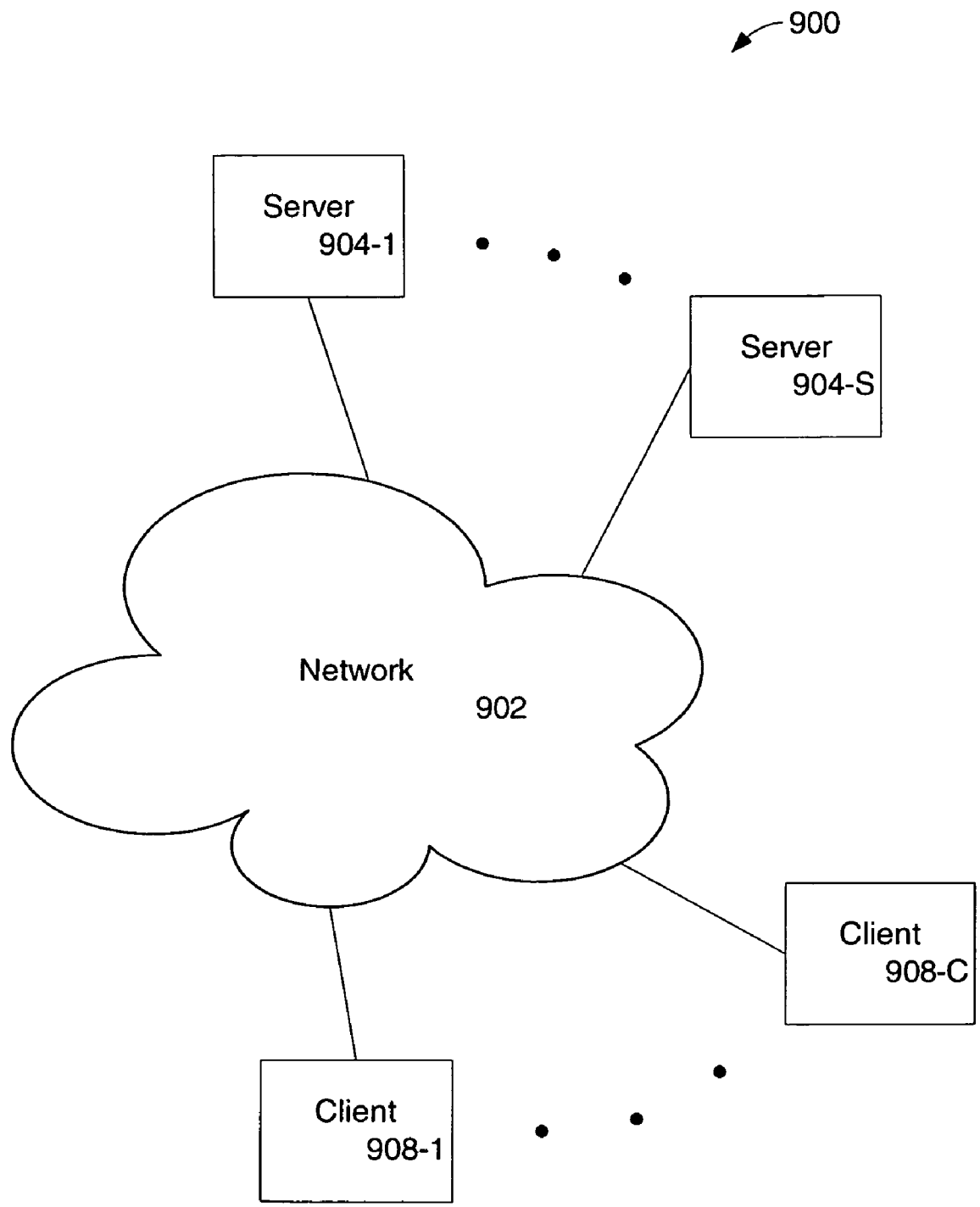
FIG. 9 illustrates a network environment in which the method and apparatus of the present invention may be implemented.

FIG. 9 illustrates a network environment 900 in which the techniques described may be applied. The network environment 900 has a network 902 that connects S servers 904-1 through 904-S, and C clients 908-1 through 108-C. As shown, several systems in the form of S servers 904-1 through 904-S and C clients 908-1 through 908-C are connected to each other via a network 1902, which may be, for example, an on-chip communication network. Note that alternatively the network 902 might be or include one or more of: inter-chip communications, an optical network, the Internet, a Local Area Network (LAN), Wide Area Network (WAN), satellite link, fiber network, cable network, or a combination of these and/or others. The servers may represent, for example: a master device on a chip; a memory; an intellectual property core, such as a microprocessor, communications interface, etc.; a disk storage system; and/or computing resources. Likewise, the clients may have computing, storage, and viewing capabilities. The method and apparatus described herein may be applied to essentially any type of communicating means or device whether local or remote, such as a LAN, a WAN, a system bus, on-chip bus, etc. It is to be further appreciated that the use of the term client and server is for clarity in specifying who initiates a communication (the client) and who responds (the server). No hierarchy is implied unless explicitly stated. Both functions may be in a single communicating device, in which case the client-server and server-client relationship may be viewed as peer-to-peer. Thus, if two devices such as 908-1 and 904-S can both initiate and respond to communications, their communication may be viewed as peer-to-peer. Likewise, communications between 904-1 and 904-S, and 908-1 and 908-C may be viewed as peer to peer if each such communicating device is capable of initiation and response to communication.

Figure 10:
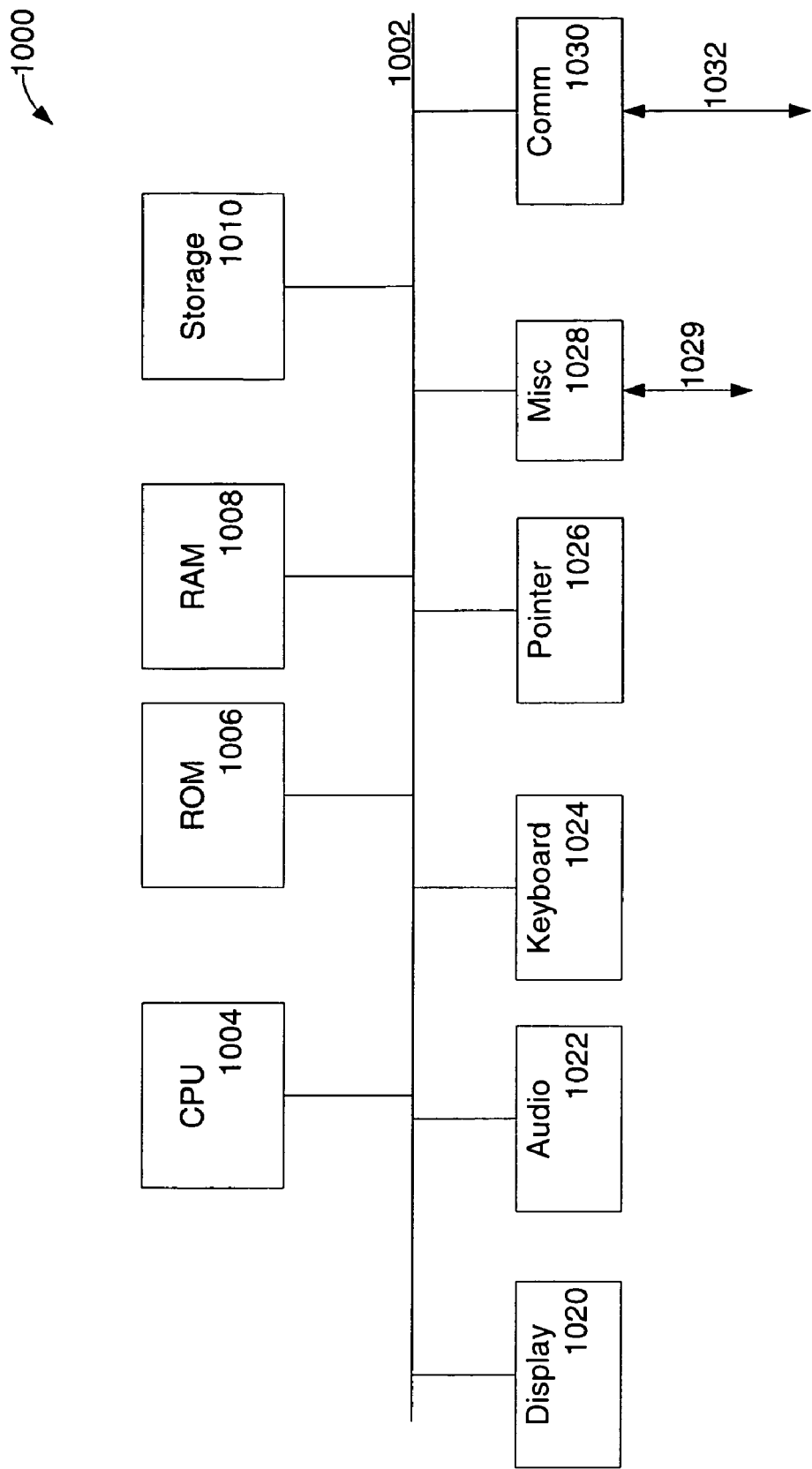
FIG. 10 is a block diagram of a computer system.

FIG. 10 illustrates a computer system 1000 in block diagram form, which may be representative of any of the clients and/or servers shown in FIG. 9. The block diagram is a high level conceptual representation and may be implemented in a variety of ways and by various architectures. Bus system 1002 interconnects a Central Processing Unit (CPU) 1004, Read Only Memory (ROM) 1006, Random Access Memory (RAM) 1008, storage 1010, display 1020, audio, 1022, keyboard 1024, pointer 1026, miscellaneous input/output (I/O) devices 1028, and communications 1030. The bus system 1002 may be for example, one or more of such buses as an on-chip bus, a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 1004 may be a single, multiple, or even a distributed computing resource. Storage 1010, may be Compact Disc (CD), Digital Versatile Disk (DVD), hard disks (HD), optical disks, tape, flash, memory sticks, video recorders, etc. Display 1020 might be, for example, a Cathode Ray Tube (CRT), Liquid Crystal Display (LCD), a projection system, Television (TV), etc. Note that depending upon the actual implementation of the system, the system may include some, all, more, or a rearrangement of components in the block diagram. For example, an on-chip communications system on an integrated circuit may lack a display 1020, keyboard 1024, and a pointer 1026. Another example may be a thin client might consist of a wireless hand held device that lacks, for example, a traditional keyboard. Thus, many variations on the system of FIG. 10 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "communicating" or "displaying" or the like, can refer to the action and processes of a computer system, or an electronic device, that manipulates and transforms data represented as physical (electronic) quantities within the electronic device or computer system's registers and memories into other data similarly represented as physical quantities within the electronic device and/or computer system memories or registers or other such information storage, transmission, or display devices.

The present invention can be implemented by an apparatus for performing the operations herein. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk- read only memories (CD-ROMs), digital versatile disk (DVD), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network. This communications network is not limited by size, and may range from, for example, on-chip communications to WANs such as the Internet.

The methods of the invention may be implemented using computer software. If written in a programming language conforming to a recognized standard, sequences of instructions designed to implement the methods can be compiled for execution on a variety of hardware platforms and for interface to a variety of operating systems. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical, or other form of propagated signals (e.g., carrier waves, infrared signals, digital signals, etc.); etc.

Thus, a method and apparatus for optimizing distributed multiplexed bus interconnects have been described.

What is claimed is:

1. A method of optimizing area on a chip while satisfying timing constraints between nodes of a distributed multiplexed bus interconnect, comprising:

searching all possible paths from an output port of a first node to reach an end node of the distributed multiplexed bus interconnect;

adding up timing components along each path to reach the end node;

maintaining a list of each unique path and an associated delay time with each path;

scaling an associated delay time with each path of the distributed multiplexed bus interconnect to select components that occupy a least amount of area on a chip and meet a required timing constraint for that path of the distributed multiplexed bus interconnect, where one or more paths in the distributed multiplexed bus interconnect have both components that have a fixed delay value as well as components that have a scalable delay value;

optimizing an amount of signaling wiring present within the distributed multiplexed bus interconnect by eliminating individual signaling wires based upon whether an Intellectual Property core connected to the distributed multiplexed bus interconnect transmits or receives signals from the multiplexed bus interconnect, wherein the multiplexed bus interconnect contains one or more multiplexers to route signals through the multiplexed bus interconnect; and supplying the scaled associated delay time with each path and associated timing constraints of the selected components to a logic synthesis tool.

2. The method of claim 1, further comprising:

selecting components that occupy the least amount of area on the chip as well as consume a least amount of power on the chip.

3. The method of claim 1, wherein the scaling proceeds by selecting components that occupy the least amount of area on the chip but create an accumulative delay time that is approximately equal to the delay time associated with required timing constraint for that path.

4. The method of claim 1, wherein the scaling further comprises scaling up a maximum delay time associated with each component in the delay path and still meeting the timing requirement by the multiplexed bus interconnect.

5. The method of claim 1, wherein the scaling further comprises scaling down a maximum delay associated with each component in the delay path to meet the timing requirement by the multiplexed bus interconnect and still meeting the timing requirement by the multiplexed bus interconnect.

6. The method of claim 5, wherein scaling down further comprises replacing a cell with a cell having a longer delay time.

7. The method of claim, 1 further comprising:

initializing a path list of potential paths between the first node and the end node;

determining all of the possible transmitting nodes to supply a signal destined for a receiver node that receives signals from the multiplexed bus interconnect;

adding all actual paths to the path list;

sorting paths in the path list from longest to shortest delay time associated with each delay path; and determining for each path a scale factor and scaling the path components with the scale factor to approximately equal the required timing constraint.

8. The method of claim 1 wherein scaling an associated delay with each path further comprises:

initializing a path delay to zero and initializing a target delay to a clock period for each path in the path list;

(a) determining if a component is not already scaled and does not have fixed delay time;

if so, setting a total path delay to equal a delay time associated with the wiring path plus a delay time associated with components in the delay path and dividing the value of the total path delay by the value of the required timing constraint; and (b) determining if the component has fixed delay time;

if so, then establishing the scale factor for components that do not have a fixed time delay based upon the value of the total path delay minus the total value of components having a fixed delay divided by the value of the required timing constraint.

9. The method of claim 1 wherein scaling an associated delay time with each path to select components further comprises:

determining each path in the path list;

determining each component in each the path; and determining if a component is not already scaled in its delay time requirement and is not fixed; and if so, scaling the allowable delay time by the component by a given scale factor and marking the component as being scaled.

10. A processing system comprising a processor, which when executing a set of instructions performs the method of claim 1.

11. A machine-readable medium having stored thereon instructions, which when executed performs the method of claim 1.

12. An article of manufacture created by the method of claim 1.

13. An apparatus, comprising:
    means for searching all possible paths from an output port of a first node to reach an end node of the distributed multiplexed bus interconnect
    means for adding up timing components along each path to reach the end node;
    means for maintaining a list of each unique path and an associated delay time with each path;
    means for scaling an associated delay time with each path of the distributed multiplexed bus interconnect to select components that occupy a least amount of area on a chip and meet a required timing constraint for that path of the distributed multiplexed bus interconnect, where one or more paths in the distributed multiplexed bus interconnect have both components that have a fixed delay value as well as components that have a scalable delay value;
    means for optimizing an amount of signaling wiring present within the distributed multiplexed bus interconnect by eliminating individual signaling wires based upon whether an Intellectual Property core connected to the distributed multiplexed bus interconnect transmits or receives signals from the multiplexed bus interconnect, wherein the multiplexed bus interconnect contains one or more multiplexers to route signals through the multiplexed bus interconnect; and
    means for supplying the scaled associated delay time with each path and associated timing constraints of the selected components to a logic synthesis tool.

14. A machine-readable medium comprising instructions, which when executed by a machine, generates a representation of the apparatus of claim 13.

15. An article of manufacture created by the apparatus of claim 13.

16. A machine-readable medium having instructions stored thereon, which when executed cause a machine to perform the following operations, comprising:
    optimizing power consumption of components on chip while satisfying timing constraints between nodes of a distributed multiplexed bus interconnect by the following,
    searching all possible paths from an output port of a first node to reach an end node of the distributed multiplexed bus interconnect;
    adding up timing components along each path to reach the end node;
    maintaining a list of each unique path and an associated delay time with each path;
    scaling an associated delay time with each path of the distributed multiplexed bus interconnect to select components that occupy a least amount of area on a chip and meet a required timing constraint for that path of the distributed multiplexed bus interconnect, where one or more paths in the distributed multiplexed bus interconnect have both components that have a fixed delay value as well as components that have a scalable delay value;
    optimizing an amount of signaling wiring present within the distributed multiplexed bus interconnect by eliminating individual signaling wires based upon whether an Intellectual Property core connected to the distributed multiplexed bus interconnect transmits or receives signals from the multiplexed bus interconnect, wherein the multiplexed bus interconnect contains one or more multiplexers to route signals through the multiplexed bus interconnect; and
    supplying the scaled associated delay time with each path and associated timing constraints of the selected components to a logic synthesis tool.

17. The machine-readable medium having instructions stored thereon of claim 16, which when executed to cause, further operations comprising:
    selecting components that occupy a least amount of area on the chip as well as consume the least amount of power on the chip.

18. The machine-readable medium having instructions stored thereon of claim 16, wherein the scaling proceeds by selecting components that consume the least amount of power but create an accumulative delay time that is approximately equal to the delay time associated with required timing constraint for that path.

19. An article of manufacture created by the operations of claim 16.

* * * * *